United States Patent [19]
Merritt

[11] Patent Number: 5,687,122
[45] Date of Patent: *Nov. 11, 1997

[54] DATA OUTPUT BUFFER

[75] Inventor: Todd Merritt, Boise, Id.

[73] Assignee: Micron Technology, Inc., Boise, Id.

[*] Notice: The term of this patent shall not extend beyond the expiration date of Pat. No. 5,513,140.

[21] Appl. No.: 638,773

[22] Filed: Apr. 29, 1996

Related U.S. Application Data

[63] Continuation of Ser. No. 252,421, Jun. 1, 1994, Pat. No. 5,513,140.

[51] Int. Cl.$^6$ .................................................... G11C 11/40
[52] U.S. Cl. ........................... 365/189.05; 365/189.11; 326/57
[58] Field of Search .................... 365/189.05, 189.11, 365/230.08; 326/57, 26, 34

[56] References Cited

U.S. PATENT DOCUMENTS

| | | | |
|---|---|---|---|
| 4,678,950 | 7/1987 | Mitake | 307/550 |
| 4,772,812 | 9/1988 | Desmaraias | 307/473 |
| 4,985,644 | 1/1991 | Okihara | 326/83 |
| 5,281,869 | 1/1994 | Lundberg | 307/443 |
| 5,311,076 | 5/1994 | Park | 326/57 |

OTHER PUBLICATIONS

Electronic News, "Samsung Pushes S–DRAMS to 1000 MHz", May 9, 1994, p. 52 (circuit depiction of Model KM44S4020AT attached).

Primary Examiner—A. Zarabian
Attorney, Agent, or Firm—Schwegman, Lundberg, Woessner & Kluth, P.A.

[57] ABSTRACT

For use in a semiconductor circuit device, a uniquely-arranged tri-state output buffer responds to a control signal generated in the semiconductor circuit device and a below-ground voltage level at an output terminal to prevent wasted drain current and substrate current, and reduce capacitance at the pull-up node driving the output terminal. The output buffer includes a power supply signal providing at least one voltage level with respect to common; an output terminal; a pull-up node; a pull-down node; a first circuit responding to the control signal by providing a first control voltage on the pull-up node; and a second circuit responding to the control signal by providing a second control voltage on the pull-down node. Further, the output buffer includes a pull-up transistor, responsive to the voltage on the pull-up node and coupled between the power supply signal and the output terminal; a pull-down transistor, responsive to the voltage on the pull-down node and coupled between common and the output terminal; a bias circuit, responsive to a voltage level on the output terminal being at a level substantially below common, arranged to bias the pull-up node downwardly and away from the voltage level provided by the power supply signal; and a disable circuit, responsive to the voltage level on the output terminal being at a level substantially below common, constructed and arranged to disable the circuit providing the control voltage on the pull-up node. The pull-up transistor provides a high-level signal at the output terminal, the pull-down transistor provides a low-level signal at the output terminal, and the bias circuit in combination with the disable circuit respond to the voltage level on the output terminal being at a level substantially below common by preventing current flow from the power supply signal to the output terminal.

20 Claims, 3 Drawing Sheets

DATA OUTPUT BUFFER

This is a continuation of application Ser. No. 08/252,421, filed Jun. 1, 1994, U.S. Pat. No. 5,513,140 which application(s) are incorporated herein by reference.

FIELD OF THE INVENTION

The present invention relates generally to semiconductor logic devices, such as memory chips, data registers and the like. More particularly, the present invention relates to such devices having data output pins which connect to input signals having voltages below common (e.g., 0 volts).

BACKGROUND OF THE INVENTION

Semiconductor logic devices, which include a wide variety of types and applications, employ logic circuitry to manipulate or store input data and an output buffer to provide the manipulated or stored data at an output terminal of the device. Depending on the type of logic device and/or the circuit environment in which the device is used, the output buffer's output terminal can be connected to one or more input signals which provide a negative voltage level, often as low as −1 volt. For example, the output terminal (or "data terminal") of a memory device, such as a DRAM, is typically used to receive input signals as well as to provide output signals. In this application, when the memory device is in the "receive" or "write" mode, the output buffer is disabled so that it does not provide a voltage bias to the input signal at the data terminal. Similarly, the output terminal of a latch, although not necessarily having a "receive" mode, is typically connected to a signal-receiving data bus, and the output terminal of the latch is controlled, so as not to provide a voltage bias to the bus.

In either situation, when the output terminal is connected to an input signal which provides a negative voltage level as low as, e.g., −1 volt, certain transistors in the output buffer can be activated. For instance, the portion of the output buffer which provides the high-level logic signals at the terminal is typically coupled to transistors which are activated in response to such a negative voltage level being presented at the output terminal. The activated transistors can cause excessive substrate current to flow and excessive drain current to pass to ground (or common) through this portion of the output buffer (sometimes referred to as "pull-up" circuitry). This results in wasted current and, in some instances, causes the output buffer to latch-up and therefore fail.

One known approach for mitigating this problem is to implement the pull-up circuitry using two transistor devices in series rather than one transistor by itself. Because the drain-source voltage across each of the two devices is reduced, the conduction of current is reduced by the same factor. A disadvantage in this approach, however, is that by doubling the number of transistors in series, the device widths must also be doubled in order to get the same drive—that requires four times as much current to drive these devices but still results in the same output current and four times as much space. Moreover, to accommodate the same level of current drive through the series-arranged transistors, the width requirement for manufacturing each transistor is effectively doubled, which represents a four-fold increase in terms of semiconductor space. Further, control circuits, including large capacitors, are often used in this arrangement to drive the series-arranged transistors, and this requires more space and impairs the speed of the output buffer. Thus, this approach is burdensome in terms of space, speed, and current consumption.

Another approach is to implement the pull-up circuitry using one pull-up device, but with an additional transistor device and resistor arranged to bias the input (or gate) of the pull-up device to a low-level voltage in response to such a negative voltage level being presented at the output terminal. This approach reduces the gate-source voltage across the pull-up device and thereby slightly reduces the substrate current and slightly reduces the consumption of drain current during this condition. Unfortunately, the extent of current reduction is relatively insubstantial. In addition, the pull-up device is still active when the negative voltage level is present at the output terminal, and this causes excess current to be drawn from other devices through the output terminal.

The above-mentioned problems are believed to have been discovered in connection with the conception and implementation of the present invention, which provides a number of features and advantages, including solutions to these problems.

SUMMARY OF THE INVENTION

Generally, the present invention provides an improved semiconductor output buffer arrangement for overcoming the previously-discussed deficiencies of the prior art. For instance, when used with N-channel pull-up transistors arranged to drive output terminals (or "pins" when the terminals connect to external leads of a chip), the present invention provides an output buffer arrangement which reduces the flow of substrate current by reducing the gate-to-source and drain-to-source voltages of the pull-up transistors when the associated output pins connect to input signals having voltages below common.

In one embodiment, the present invention provides a semiconductor chip, comprising a logic circuit generating a control signal and an output circuit which is responsive to the control signal. The output circuit includes an output terminal, a high-level circuit having an input arranged to bias the output terminal toward a high-level voltage, a low-level circuit for biasing the output terminal toward a low-level voltage, and a disable circuit coupled to the input of the high-level circuit and responsive to a low-level signal at the output terminal, the low-level signal having a voltage less than the low-level voltage. The disable circuit responds to the low-level signal by causing the current through the high-level circuit to be interrupted.

In another embodiment, the present invention provides a tri-state output buffer for use in a semiconductor circuit device. The output circuit, which is responsive to a control signal generated in the semiconductor circuit device, comprises a power supply signal providing at least one voltage level with respect to common, an output terminal, a pull-up node, a pull-down node, a first circuit responding to the control signal by providing a first control voltage on the pull-up node, and a second circuit responding to the control signal by providing a second control voltage on the pull-down node. Further, a pull-up transistor responds to the voltage on the pull-up node and is coupled between the power supply signal and the output terminal, and a pull-down transistor responds to the voltage on the pull-down node and is coupled between common and the output terminal. A bias circuit, responsive to a voltage level on the output terminal being at a level substantially below common, is constructed and arranged to bias the pull-up node downwardly and away from the voltage level provided by the power supply signal. A disable circuit, responsive to the voltage level on the output terminal being at a level substantially below common, is constructed and arranged to disable the circuit providing the control voltage on the pull-up node. The pull-up transistor provides a high-level signal at the output terminal, the pull-down transistor provides a low-level signal at the output terminal, and the bias and disable circuits respond to the voltage level on the output terminal being at a level substantially below common by preventing current flow from the power supply signal to the output terminal.

The above summary of the present invention is not intended to present each embodiment or every aspect of the present invention. This is the purpose of the figures and the associated description which follow.

BRIEF DESCRIPTION OF THE DRAWINGS

Other aspects and advantages of the present invention may become apparent upon reading the following detailed and upon reference to the drawings in which.

Figure 1:
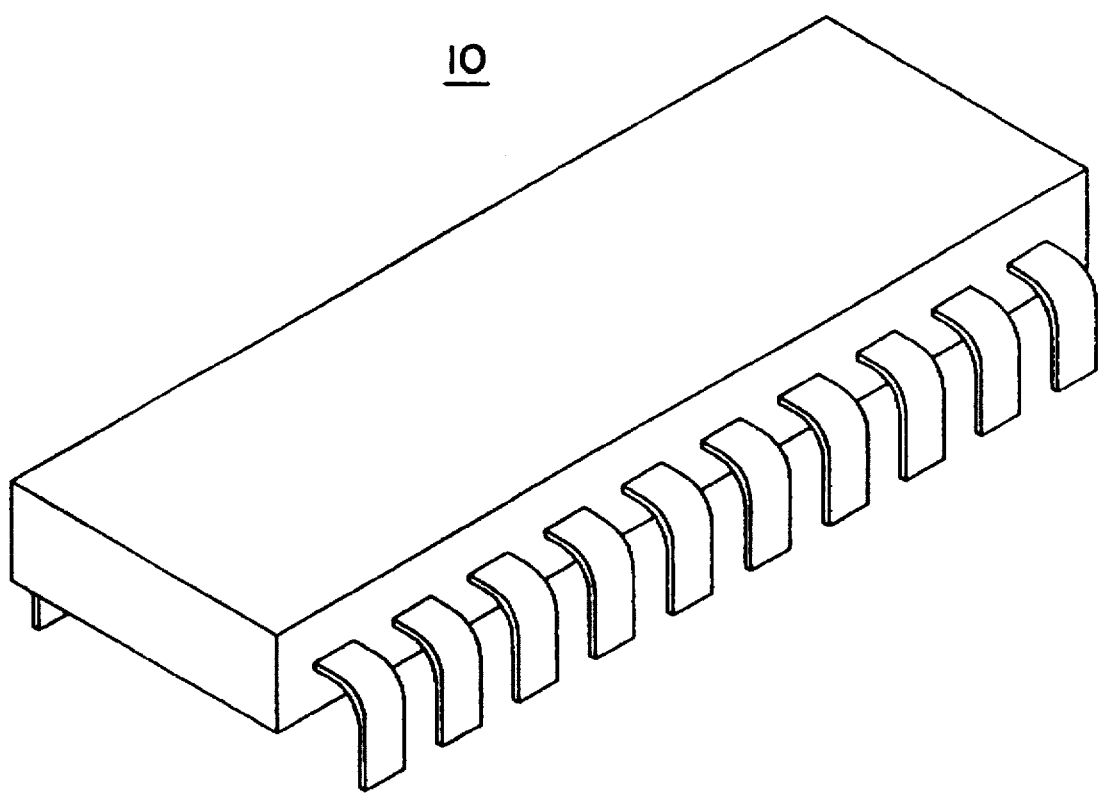
FIG. 1 is a perspective illustration of a semiconductor chip exemplifying a type of circuit device which may incorporate the principles of the present invention.

While the invention is susceptible to various modifications and alterative forms, specifics thereof have been shown by way of example in the drawings and will be described in detail. It should be understood, however, that the intention is not to limit the invention to the particular embodiment described. On the contrary, the intention is to cover all modifications, equivalents, and alternatives falling within the spirit and scope of the invention as defined by the appended claims.

DETAILED DESCRIPTION OF THE DRAWINGS

The present invention has a wide variety of applications in semiconductor circuits having an output buffer (or circuit) which can receive an input signal at a level that is substantially below common. For instance, the present invention has application in connection with output buffers used in memory chips, data registers, counters and flip-flops, each of which may be arranged in a conventional semiconductor package. Such a package is denoted by the reference numeral 10 in FIG. 1.

Figure 2:
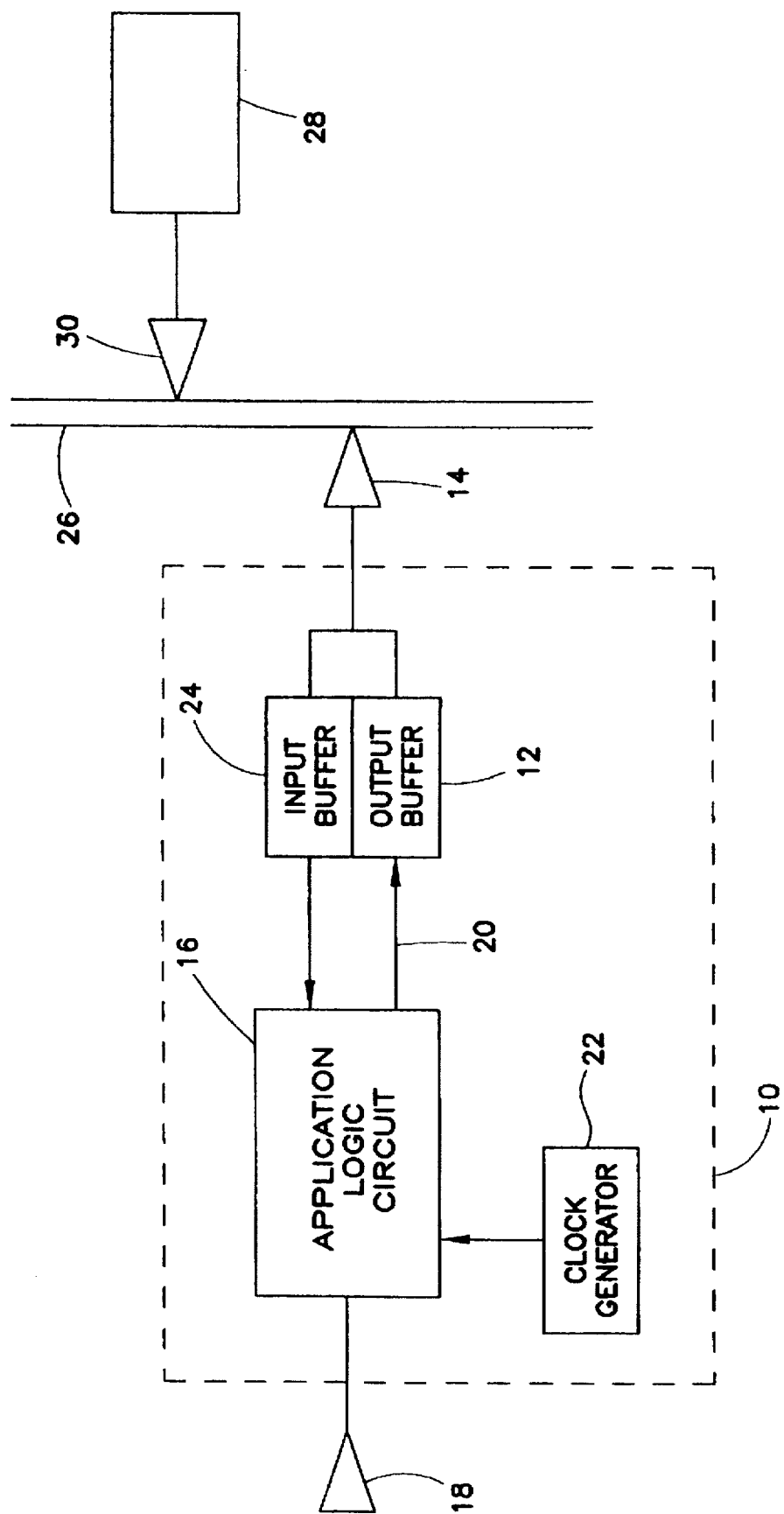
FIG. 2 is a block diagram of an exemplary arrangement and use of an output buffer implemented in accordance with the present invention.

FIG. 2 illustrates, in block diagram form, an exemplary arrangement and use of an output buffer 12 implemented in accordance with the present invention. The output buffer 12 provides a digital data signal at an output terminal 14 indicative of a signal provided by an application logic circuit 16. The application logic circuit 16 represents the principle functioning portion of the circuitry depicted by the package or chip 10. As mentioned above, the application logic circuit 16 may be the functioning and primary circuitry of a memory chip, a data register, a counter, a flip flop, etc.

In the implementation illustrated in FIG. 2, the application logic circuit 16 receives input data at an input terminal 18. After manipulating and/or storing the input data, the application logic circuit 16 produces a control signal at line 20 which is used by an output buffer 12 to produce a corresponding digital signal at the output terminal 14. Depending on the function of the chip, a clock generator 22 may or may not be used in connection with the application logic circuit 16. The clock generator 22 may be internal or external to the chip depicted in FIG. 2.

The chip 10 may also include, as an option, an input buffer 24 which buffers data received from the output terminal 14 from a data bus (or conductor) 26. Another chip 28, having an output terminal 30 connected to the data bus 26, would typically provide such a signal. In this so-called "data-receive" mode, the application logic circuit 16 disables the output buffer 12 when it is not providing data to the terminal 14. This disable feature is useful in that it prevents the output buffer 12 from interfering with data designated for reception by the input buffer 24. This disable feature is also useful where such an input buffer 24 is not present or not receiving data from the bus 26, in which case the chip 28 can still provide data on the bus 26 for reception by other peripherals connected to the bus 26.

Figure 3:
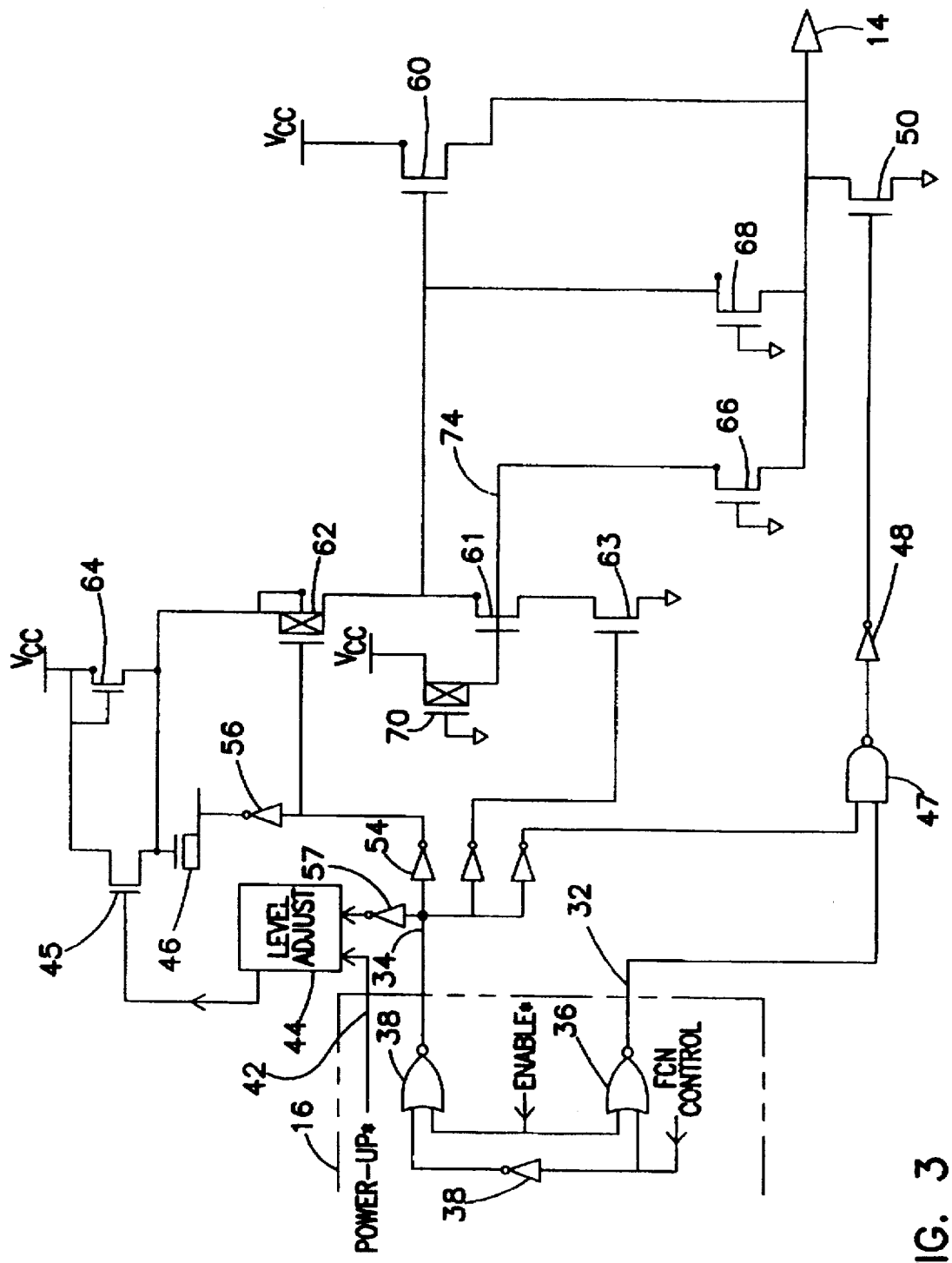
FIG. 3 is a detailed schematic of an output buffer, which is implemented in accordance with the principles of the present invention.

FIG. 3 provides an exploded view of the output buffer 12 of FIG. 2 along with the portion of the application logic circuit 16 which provides the control signal on line 20 of FIG. 2. In FIG. 3, the control signal is provided by the application logic circuit 16 as a differential signal on lines 32, 34. The control signal is controlled by two signals generated within the application logic circuit 16, "Enable*" and "Function (Fcn) Control." These signals are used to control the signal at the output terminal 14 between three logic states, low, high and high-impedance. Before discussing the high-impedance state, which concerns the condition where an input signal substantially below common is presented at the terminal 14, the low and high states require discussion.

When Enable* is low, Function Control regulates the logic level at the terminal 14. When Function Control is high, the signal on line 32 is low via a NOR gate 36. When Function Control is low, the input to a NOR gate 38 is high via an inverter 40, and the output of the signal on line 34 is low.

The application logic circuit 16 also provides a Power-up* signal on line 42 to maintain a conventional level adjust circuit 44 in a disabled mode until the power supply is fully stable. The level adjust circuit 44 effectively translates a high-logic level signal at the output of an inverter 57 (e.g., Vcc at 3.3 volts) to an increased voltage level, Vccp (e.g., 5.3 volts). As addressed further below, this provides the appropriate bias for N-channel transistors 45, 46.

Assuming that Enable* is low, this differential control signal is processed by the output buffer of FIG. 3, such that the logic level of the signal at the output terminal 14 follows the logic level of Function Control. When the signal at line 32 is low (Function Control being high), the signal at line 34 is high, the output of a NAND gate 47 is high, the output of an inverter 48 is low, and an N-channel transistor 50 is de-activated, so that no downward bias is presented to the signal at the output terminal 14. In response to the signal at the output of the inverter 57 going high, the output of the level adjust circuit 44 activates the transistor 45 to bias the gate side of the capacitor-arranged transistor 46 toward Vcc. Immediately following and via an inverter 54, the signal at the output of an inverter 56 goes high and causes the pulled-up voltage on the gate side of the transistor 46 to be doubled. This voltage on the gate side of the transistor 46 is coupled to the gate of a pull-up transistor 60, via an activated P-channel transistor 62, to bias the signal at the output terminal 14 toward Vcc.

A transistor 64 is coupled between Vcc and the source of the transistor 62 to ensure that the voltage at the boot node (at the top of the capacitor 64) does not drop below Vcc—Vt (where Vt is the threshold level of an N-channel transistor, e.g., about 0.7 volts).

When the signal at line 32 is high (Function Control being low), the signal at line 34 is low, the transistors 60 and 62 are de-activated, the output of the NAND gate 47 is low, the output of the inverter 48 is high, and the transistor 50 is activated to pull the signal at the output terminal 14 to ground. A P-channel transistor 70, which is normally activated, provides a high-level bias to the gate of a transistor 61, so that a transistor 63 can maintain the transistor 60 in the de-activated state when Function Control is low.

When Enable* is high, Function Control has no control over the logic level at the terminal 14; rather, Enable* being high causes the respective outputs of the NOR gates 36, 38 to be low and the transistors 50, 60 to be de-activated, thereby sending the signal at the output terminal 14 to the high-impedance state and permitting externally generated logic signals to bias the output terminal 14 without influence by the output buffer of FIG. 3. When the voltage level of such an externally generated signal is greater than about 0 volts minus the threshold voltage of N-channel transistors 66, 68, the externally generated signal does not affect the output buffer. When the voltage level of such an externally generated signal is less than about 0 volts minus the threshold voltage of N-channel transistors 66, 68, the externally generated signal causes these transistors 66, 68 to activate which, at least initially, causes current to drain from the current path established through the transistor 70.

Shortly thereafter, the transistor 66 attempts to pull the drain of the transistor 70 toward the level of the externally generated signal and in the opposite direction of the pull by the transistor 70 toward Vcc. Because the mobility factor of an N-channel transistor is 1.5 times greater than the mobility factor of a P-channel transistor and assuming that the drive of the transistor 66 is significantly greater than the drive of the transistor 70 (e.g., about or more than an order of magnitude greater than the drive of the transistor 70 (for instance, a beta ratio of 11)), the contention between the transistors 66, 70 is won by the transistor 66 which then pulls line 74 toward the level of the externally generated signal. This results in the deactivation of the transistor 61, thereby breaking the current path provided along the source-to-drain path of the N-channel transistor 63 and permitting the transistor 68 to completely de-activate the transistor 60 by pulling its gate voltage to below ground. Because this current path is broken, the transistor 68 can be relatively small with respect to the beta ratio of the N-channel transistors 61 and 63. Moreover, with the transistor 60 completely de-activated, substrate current flow through the transistor 60 is eliminated. Further, the output buffer of FIG. 3 is implemented with only a nominal amount of capacitance on the pull-up node (at the gate of the transistor 60), which means that the output buffer is faster and operates with less current than previously known output buffers.

Except for the exemplary width dimensions mentioned for transistors 66 and 70, the sizes of the various other transistors shown in FIG. 3 are not critical.

The principles of the present invention, which have been disclosed by way of the above illustrations and discussion, can be implemented using various circuit types and arrangements, examples of which follow. The application logic circuit can provide the control signal to the output buffer in differential or non-differential form and can be implemented with or without circuitry latching the control signal. The various signals used to enable and disable the operation of certain signals and/or current paths, of course, can be connected at different points along the signal paths. Using a negative power supply, "common" corresponds to the highest voltage level, and the other voltage and signal levels are translated accordingly.

As another possible modification, the present invention can be used in combination with the current booster implementation of pending U.S. patent application Ser. No. 08/238,972, entitled "NMOS OUTPUT BUFFER HAVING A CONTROLLED HIGH-LEVEL OUTPUT," filed on May 5, 1994 (Atty. Docket No. MICD-074). In this instance, a booster circuit, as described therein, is used to provide a current boost signal at the source of the P-channel transistor 62 to overcome leakage current through parasitic resistance at the gate of the pull-up transistor 60. Similarly-arranged diode-clamping circuits, as described and illustrated in this co-pending application, can also be used.

Those skilled in the art will readily recognize that these and various other modifications and changes may be made to the present invention without strictly following the exemplary application illustrated and described herein and without departing from the true spirit and scope of the present invention, which is set forth in the following claims.

I claim:

1. A semiconductor chip, comprising:

a logic circuit providing a control signal; and an output circuit, responsive to the control signal, including an output terminal, a high-level circuit having an input and arranged to bias the output terminal toward a high-level reference voltage through a pull-up switch, a low-level circuit for biasing the output terminal toward a low-level reference voltage, and a disable circuit coupled to the input of the high-level circuit and responsive to a low-level signal at the output terminal, the low-level signal being less than the low-level reference voltage, and the disable circuit responding to the low-level signal by disabling the high-level circuit by coupling a control of the pull-up switch to the output terminal and causing current flow therethrough to be interrupted by disabling an interrupt switch coupled to the control of the pull-up switch, a control of the interrupt switch coupled to the output terminal through a coupling switch.

2. A semiconductor circuit device, according to claim 1, further including a voltage-doubling circuit for activating the high-level circuit.

3. A semiconductor circuit device according to claim 1, wherein the disable circuit includes a first switch circuit coupled between the input of the high-level circuit and the output terminal.

4. A semiconductor circuit device, according to claim 3, wherein the first and second switch circuits are implemented using transistors with respective switching functions at least partly controlled by the low-level signal.

5. A semiconductor circuit device, according to claim 4, wherein the transistors provide at least one drive current path to the output terminal.

6. A semiconductor circuit device, according to claim 1, wherein the logic circuit generates an enable signal to control the control signal between an operative mode and an inoperative mode.

7. A semiconductor circuit device according to claim 1, wherein the pull-up switch is a p-channel transistor.

8. A semiconductor circuit device, according to claim 1, wherein the disable circuit includes an N-channel transistor, a P-channel transistor, and a contention node arranged in a current path joining the N-channel and P-channel transistors, wherein the N-channel transistor responds to the low-level signal by overpowering the P-channel transistor and setting the contention node to a voltage level to disable the pull-up circuit.

9. For use in a semiconductor circuit device, an output buffer responsive to a control signal generated in the semiconductor circuit device, the output buffer comprising:

a power supply signal providing at least one voltage level with respect to common;

an output terminal;

a pull-up node;

a circuit responding to the control signal by providing a control voltage on the pull-up node;

a pull-up circuit, responsive to the voltage on the pull-up node and coupled between the power supply signal and the output terminal;

a bias circuit, responsive to a voltage level on the output terminal being at a level substantially below common, constructed and arranged to bias the pull-up node downwardly and away from the voltage level provided by the power supply signal;

a disable circuit, responsive to the voltage level on the output terminal being at a level substantially below common, constructed and arranged to disable the circuit providing the control voltage on the pull-up node, the disable circuit includes an N-channel transistor, a P-channel transistor and a contention node arranged in a current path joining the N-channel and P-channel transistors.

10. An output buffer, according to claim 9, wherein the disable circuit includes at least a portion of the bias circuit.

11. An output buffer, according to claim 9, wherein the level substantially below common is about equal to the voltage threshold necessary to activate an N-channel transistor.

12. An output buffer, according to claim 11, wherein common corresponds to 0 volts.

13. An output buffer, according to claim 12, wherein the power supply signal is greater than about 3 volts.

14. An output buffer, according to claim 13, further including a level adjust circuit providing a pumped power supply signal for providing power to the pull-up circuit.

15. An output buffer, according to claim 9, wherein the N-channel transistor overpowers the P-channel transistor and sets the contention node to a voltage level to disable the circuit providing the control voltage.

16. An output buffer, according to claim 15, wherein the drive of the N-channel transistor is at least an order of magnitude greater than the drive of the P-channel transistor.

17. For use in a semiconductor circuit device, a tri-state output buffer responsive to a control signal generated in the semiconductor circuit device, the output buffer comprising:

a power supply signal providing at least one voltage level with respect to the common;

an output terminal;

a pull-up node;

a pull-down node;

a first circuit responding to the control signal by providing a first control voltage on the pull-up node;

a second circuit responding to the control signal by providing a second control voltage on the pull-down node;

a pull-up transistor, responsive to the voltage on the pull-up node and coupled between the power supply signal and the output terminal;

a bias circuit, responsive to a voltage level in the output terminal being at a level substantially below common, constructed and arranged to bias the pull-up node downwardly and away from the voltage level provided by the power supply signal; and a disable circuit, responsive to the voltage level on the output terminal being at a level substantially below common, constructed and arranged to disable the circuit providing the control voltage on the pull-up node, including a contention node which is biased by the disable circuit to substantially offset the control voltage on the pull-up node;

wherein the pull-up transistor provides a high-level signal at the output terminal, the pull-down transistor provides a low-level signal at the output terminal, and the bias circuit in combination with the disable circuit respond to the voltage level on the output terminal being at a level substantially below common by preventing current flow from the power supply signal to the output terminal.

18. An output buffer, according to claim 17, wherein the disable circuit includes at least a portion of the bias circuit.

19. The semiconductor chip of claim 1 wherein the pull-up switch is an n-channel transistor, the interrupt switch is an n-channel transistor coupled between a gate of the pull-up switch and the low level reference, and the coupling switch is an n-channel transistor coupled between a gate of the interrupt switch and the output terminal.

20. The semiconductor chip of claim 19 further comprising a p-channel transistor coupled between the gate of the interrupt switch and the high level reference.

* * * * *